United States Patent [19]
Sato et al.

[11] Patent Number: 5,387,793
[45] Date of Patent: Feb. 7, 1995

[54] SCANNING ELECTRON MICROSCOPE

[75] Inventors: Mitsugu Sato, Katsuta; Hideo Todokoro, Tokyo; Tadashi Otaka, Katsuta, all of Japan

[73] Assignee: Hitachi, Ltd., Tokyo, Japan

[21] Appl. No.: 133,860

[22] Filed: Oct. 12, 1993

[30] Foreign Application Priority Data

Oct. 15, 1992 [JP] Japan ................. 4-301541

[51] Int. Cl.⁶ ......................................... H01J 37/244
[52] U.S. Cl. ..................................... 250/310; 250/397
[58] Field of Search ............... 250/310, 397, 396 R, 250/346 ML

[56] References Cited

U.S. PATENT DOCUMENTS 4,442,355  4/1984  Tamura et al. ................. 250/397
4,714,833  12/1987  Rose et al. .

FOREIGN PATENT DOCUMENTS 3532781   3/1987  Germany .
52-91361  1/1977  Japan .
60212953  10/1985  Japan .
61-99960  6/1986  Japan .
63-110543 5/1988  Japan .
2168839   6/1986  United Kingdom .
2187038   8/1987  United Kingdom .

OTHER PUBLICATIONS

Mulvey T. "Scanning Electron Microscopy" Apr. 1974, pp. 43–50, proceedings of the Seventh Annual IIT Research Institute, Chicago, Ill.

Primary Examiner—Jack I. Berman
Assistant Examiner—Kiet T. Nguyen
Attorney, Agent, or Firm—Antonelli, Terry, Stout & Kraus

[57] ABSTRACT

Provided between an optical axis of a primary electron beam directed to a specimen and a secondary electron detector for detecting secondary electrons emitted from the specimen is a shielding electrode which has a transparency for secondary electrons and has a shielding effect for an attracting electric field produced by the secondary electron detector. An opposed electrode is provided at a position facing the shielding electrode with the optical path of the electron beam disposed therebetween. Applied across the shielding electrode and the opposed electrode is a voltage which produces a deflecting electric field along the electron beam path in the vicinity of the secondary electron detector. The deflecting electric field deflects the secondary electrons to the shielding electrode side so that they pass therethrough before they are captured by the secondary electron detector. Optical axis correction coils are provided for generating a magnetic field to correct any bending effect on the trajectory of the primary electron beam by the deflecting electric field.

9 Claims, 4 Drawing Sheets

SCANNING ELECTRON MICROSCOPE

BACKGROUND OF THE INVENTION

The present invention relates to a scanning electron microscope that produces a scan image on the basis of secondary electrons emitted by irradiating an electron beam onto a specimen. More particularly, it concerns a scanning electron microscope that is capable of efficiently capturing secondary electrons to obtain an image of high resolution.

A most popular method for improving resolution of a scanning electron microscope is to shorten the focal length of an objective lens and place a specimen in the magnetic field of the objective lens. Methods of placing the specimen in the magnetic field of the objective lens include a so-called in-lens method that places the specimen between magnetic poles of the objective lens, as disclosed in, for example, the Japanese Patent Application Laid-Open No. 63-110543, and a method in which an objective lens (snorkel lens) is shaped to allow an objective lens magnetic field to leak out to a specimen side so that the specimen is substantially placed in the objective lens magnetic field even if the specimen is positioned below the objective lens, as disclosed by Mulvey in "*Scanning Electron Microscopy,*" 1974, p44.

In both of the above-mentioned disclosures, with the specimen placed in the objective lens magnetic field, the secondary electrons emitted from the specimen are captured by the magnetic field of the objective lens and travel toward the top of the objective lens. For this reason, the secondary electrons emitted from the specimen must be detected close to the top of the objective lens.

Even if the specimen is placed out of the magnetic field of the ordinary objective lens, in order to shorten the focal distance and minimize the lens aberration, the specimen is preferably placed as close to the bottom of the objective lens as practical. In such a method, also, the secondary electrons have to be detected at the top of the objective lens.

In order for the secondary electron detector to capture the secondary electrons, the secondary electron detector needs to have a high voltage of around 10 kV applied thereto to produce an attracting electric field. However, this attracting electric field may undesirably bend the trajectory of the primary electron beam. As a result, the deflecting of the primary beam changes the incoming position of the primary electron beam on the objective lens, causing an axial deviation.

Further, the attracting electric field produced by the secondary electron detector causes astigmatism and other disturbances. These difficulties are too serious to realize high resolution.

To prevent such adverse effects of the attracting electric field produced by the secondary electron detector, many proposals have been made.

As an example, the Japanese Patent Application Laid-Open No. 52-91361 suggests use of a shielding casing for covering the electron beam path in front of the secondary electron detector. However, the shielding casing cannot fully prevent the effect of the electric field of the secondary electron detector as the secondary electrons cannot be detected unless the electric field leaks onto the optical axis.

As another example, the Japanese Patent Application Laid-Open No. 63-110543 suggests that the attracting electric field produced by the secondary electron detector be formed so as to the axially symmetrical. However, this involves a problem that the detection efficiency of the secondary electrons around the center axis is lowered because of the axial symmetry of the attracting electric field of the secondary electrons.

As still another example, the Japanese Utility model Application Laid-Open No. 61-99960 proposes a method in which the trajectory of the primary electron beam bent by an attracting electric field of a secondary electron detector is corrected by a two-stage deflector provided at the top of the secondary electron detector. However, also, this method cannot prevent the attracting electric field produced by the secondary electron detector from leaking into an electron beam path, causing adverse effects, such as astigmatism.

As still a further example, the Japanese Patent Application Laid Open No. 60-212953 discloses a method in which additional electrodes and coils are provided to produce an electric field and magnetic field which are orthogonal to each other to correct any bending of the trajectory of the primary electron beam before leading secondary electrons to the secondary electron detector which is positioned above the electrodes and coils. However, this method does not take into account any leaking of a non-uniform attracting electric field produced by the secondary electron detector onto the optical axis.

As described above, each of the attempts to solve these problems in the prior art has its merits and demerits. Thus, there is still a strong demand to provide a scanning electron microscope capable of detecting secondary electrons more efficiently.

SUMMARY OF THE INVENTION

With a view toward solving the foregoing problems of the prior art, it is an object of the present invention to provide a scanning electron microscope which is capable of efficiently detecting secondary electrons without producing astigmatism and axial deviation in the primary electron beam even with detection of the secondary electrons at a position above an objective lens.

In order to achieve the above-mentioned object, the present invention includes a scanning electron microscope that scans a primary electron beam emitted from an electron source on a specimen and detects secondary electrons emitted from the specimen on a electron source side of an objective lens, that comprises a secondary electron detector having means for producing an attracting electric field to capture secondary electrons; a shielding electrode provided between the electron beam path and the secondary electron detector, the shielding electrode having a transparency for the secondary electrons and a shielding effect for the attracting electric field produced by the secondary electron detector; an opposed electrode provided at a position facing the shielding electrode with the electron beam path being disposed therebetween and having a voltage applied between itself and the shielding electrode to produce a deflecting electric field in the electron beam path; and a coil arrangement for producing a magnetic field in a direction orthogonal to the deflecting electric field and the primary electric beam.

With the arrangement described above, the shielding electrode can shield the attracting electric field produced by the secondary electron detector to capture the secondary electrons, thereby preventing the attracting electric field from leaking into the electron beam path.

Besides, the magnetic field produced by the coil arrangement can correct any bending of the trajectory of the primary electron beam by action of the deflecting electric field produced by the shielding electrode, thereby preventing the primary electron beam from deviating axially As for the secondary electrons, these can be easily detected as the deflection direction of the magnetic field is the same as that of the deflecting electric field, thereby providing a large deflection of the secondary electrons.

DESCRIPTION OF THE PREFERRED EMBODIMENTS

Figure 1:
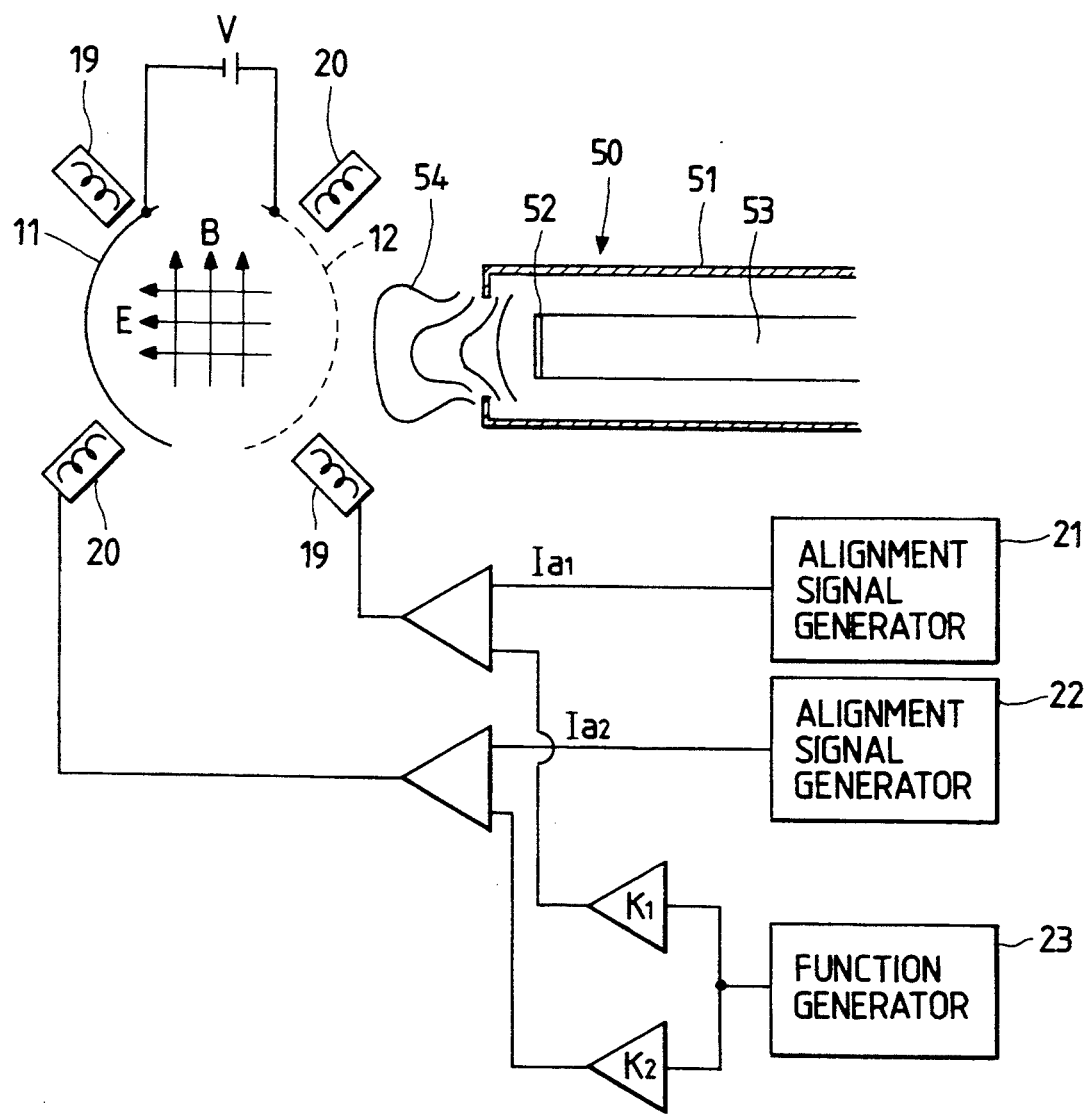
FIG. 1 is a cross-sectional view illustrating principles of the present invention.

The following describes in detail a basic concept according to the present invention by reference to FIG. 1.

FIG. 1 depicts a cross-sectional view illustrating a secondary electron detector 50 and its peripheries of a scanning electron microscope according to the present invention. An electron source emits a primary electron beam, which is irradiated along a path which extends depthwise from outside to inside in the drawing through a space between electrodes 11 and 12.

A secondary electron detector 50 comprises an attracting electrode 51, a scintillator 52, and light guide 53. Secondary electrons are attracted by an attracting electric field 54 generated by the attracting electrode 51 and are accelerated to the scintillator 52 by a positive potential applied thereto to thereby radiate light from the scintillator 52. The radiated light is guided by the light guide 53 to a photomultiplier (not shown) to be converted into an electric signal, which is fed to an intensity modulation input of a CRT.

A shielding electrode 12 is provided between the secondary electron detector 50 and the electron beam path to shield parts of an electron beam path. An opposed electrode 11 is also provided at a position facing the shielding electrode 12 with the electron beam path being disposed therebetween. The shielding electrode 12 can be a porous plate or mesh-like member having a transparency for the secondary electron and having a shielding effect for the attracting electric field 54.

Figure 3:
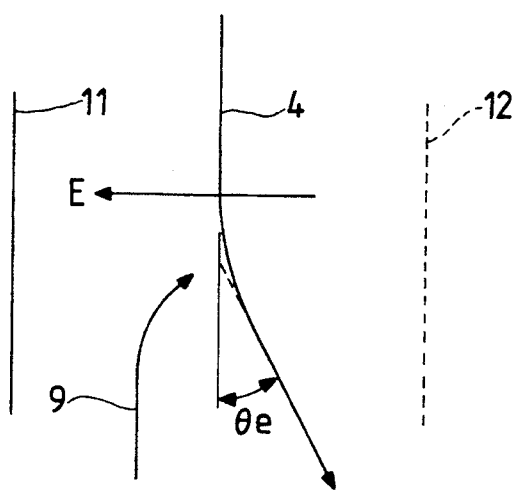
FIG. 3 shows behaviors of a primary electron beam and secondary electrons deflected by a deflecting electric field E.

With such a construction as described above, a potential difference V is applied between the shielding electrode 12 and the opposed electrode 11 to produce a deflection electric field E. The primary electron beam 4 is accelerated by an acceleration voltage Vacc and, as shown in FIG. 3, is deflected by an angle $\phi e = Ke \times V/\sqrt{Vacc}$ in proportion to V/Vacc to the shielding electrode 12 side by the deflecting electric field E, where Ke is a constant determined in terms of the shapes and positions of the shielding electrode 12 and the opposed electrode 11.

Figure 4:
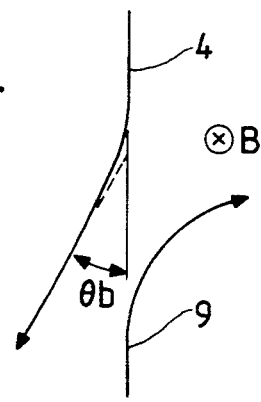
FIG. 4 shows behaviors of a primary electron beam and secondary electrons deflected by a magnetic field B.

On the other hand, two sets of optical axis correction coils 19 and 20 are provided around the electron beam path and are supplied with excitation currents so as to produce a composite or combined excitation current I(A) to generate a corresponding composite or combined magnetic field B along the electron beam path in a direction orthogonal to both the deflecting electric field E and the electron beam optical path. As shown in FIG. 4, the primary electron beam 4 is deflected $\phi b = Kb \times I/\sqrt{Vacc}$ in proportion to $I/\sqrt{Vacc}$ by Lorenz's force in a direction reverse to that of the deflection by the deflecting electric field E, where Kb is a constant determined in terms of the shapes and positions of the optical axis correction coils 19 and 20.

Figure 5:
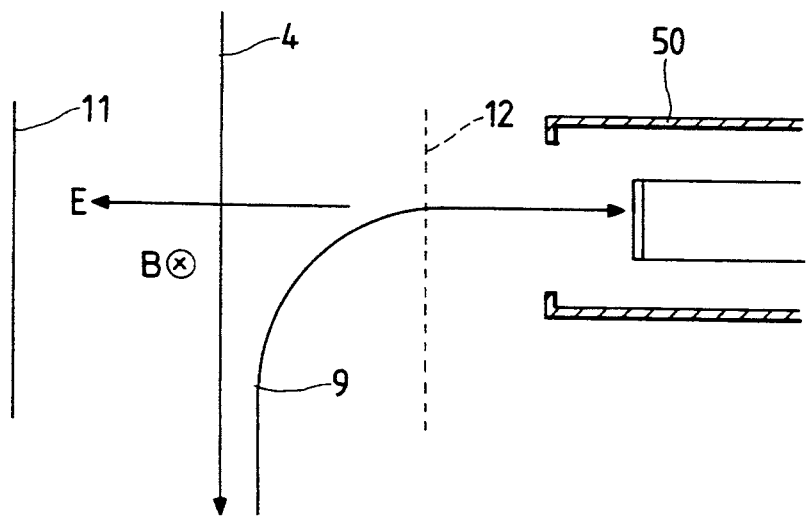
FIG. 5 shows behaviors of a primary electron beam and secondary electrons deflected by interaction of a deflecting electric field E and a magnetic field.

If the deflecting electric field E and the magnetic field B, which are orthogonal to each other, exist at the same time, a composite or combined force of the deflecting electric field E and the magnetic field B determines the trajectory of the primary electron beam 4. If the potential difference V and the combined excitation current I can be selected to satisfy $\phi e = \phi b$, as shown in FIG. 5, the primary electron beam 4 can be made to go straight without any deviation.

That is, if K=Ke/Kb, the combined excitation current I for the optical axis correction coils 19 and 20 can be controlled to always make the primary electron beam 4 go straight with any acceleration voltage Vacc so that the combined excitation current I is $I = K \times V/\sqrt{Vacc}$. As the deflecting electric field E and the magnetic field B are virtually uniform around the optical axis, there will be no astigmatism due to a non-uniform electromagnetic distribution. On the other hand, as shown in FIG. 3, the deflecting electric field E can deflect the secondary electrons 9 emitted from a specimen 7 in the same direction as the primary electron beam 4. The magnetic field B, as shown in FIG. 4, can deflect the secondary electrons 9 in the direction reverse to the primary electron beam 4 since the secondary electrons 9 are moving in a direction opposite to the primary electron beam 4.

That is, as both the deflecting electric field E and the magnetic field B act on to the secondary electrons 9 to lead them to the secondary electron detector 50, they sharply bend the trajectory of those secondary electrons 9, which have little energy to cause them to pass through the shielding electrode 12, so that the secondary electrons 9 are captured by the secondary electron detector 50. As the non-uniform attracting electric field 54 produced from the secondary electron detector 50 is shielded by the shielding electrode 12, the attracting electric field 54 cannot affect the primary electron beam 4, causing no astigmatism.

An arrangement for producing the deflecting electric field E and the magnetic field B orthogonal to each other has been used as a kind of energy filter, called a Wien filter. The electromagnetic field strength needed for this energy filter causes the electron beam to disperse energy, resulting in a large chromatic aberration. However, the electromagnetic field strength for bending the trajectory of the secondary electrons having a few to some ten electron volts causes so little energy dispersion in the primary electron beam having tens of times the energy that the effect of the chromatic aberration can be virtually ignored.

In turn, the following describes an embodiment of the present invention in detail.

Figure 2:
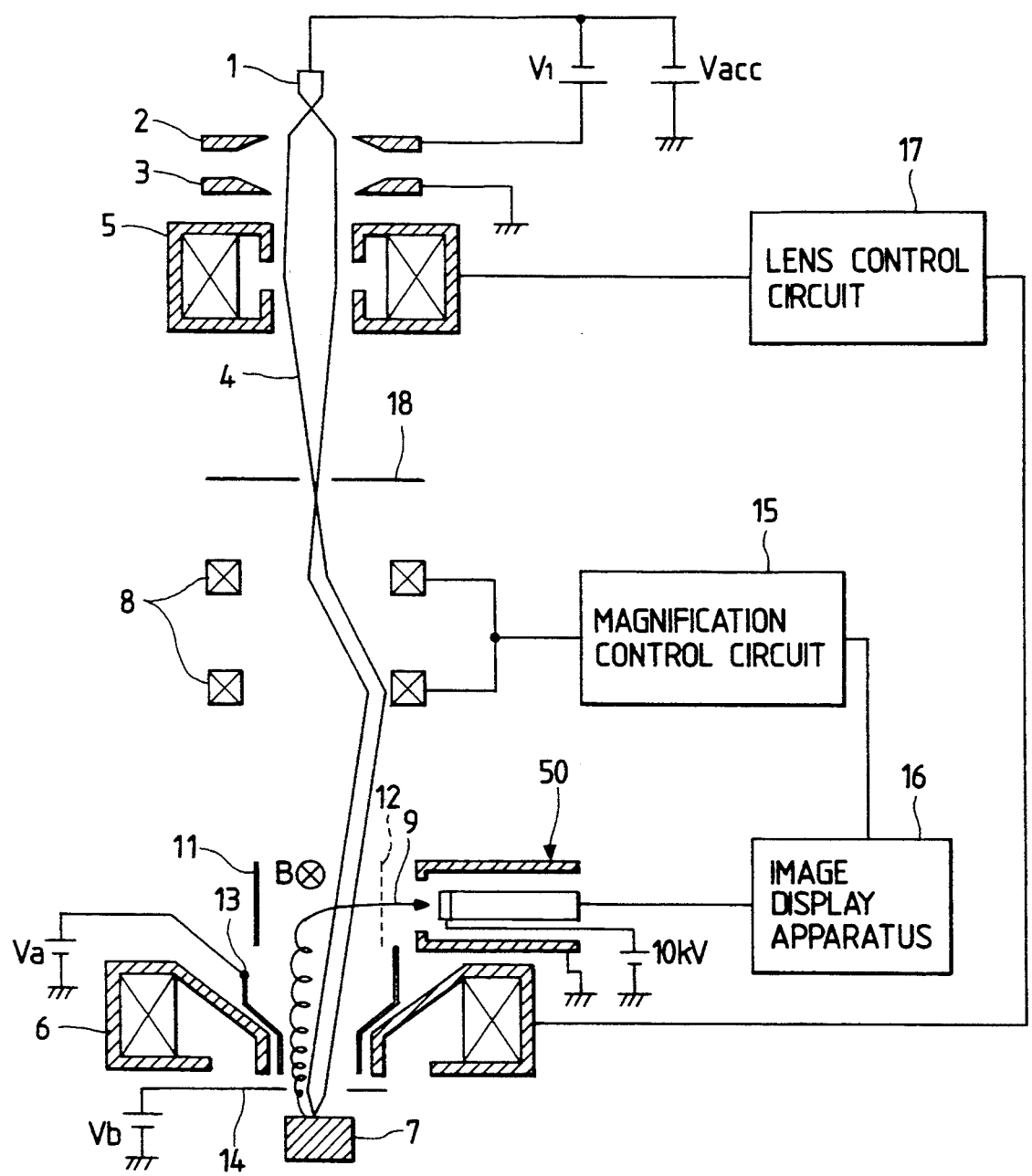
FIG. 2 is a schematic diagram illustrating an embodiment of the present invention.

FIG. 2 depicts a schematic diagram illustrating a scanning electron microscope in accordance with an embodiment of the present invention. Arrangements and parts in the Figure identical with those mentioned above are indicated by the same reference numbers.

The primary electron beam 4 is radiated from a cathode 1 by an extracting voltage V1 applied between the cathode 1 and a first anode 2. The primary electron beam 4 then is accelerated by the accelerating voltage Vacc applied between the cathode 1 and a second anode 3 to travel to a succeeding lens system.

The accelerated primary electron beam 4 is focused into a minute spot on the specimen 7 by the lens action of a focusing lens 5 and an objective lens 6 controlled by a lens control circuit 17. The focused primary electron beam 4 is scanned on the specimen 7 by a scanning coil 8 two-dimensionally. In the embodiments the scanning coil 8 is formed of two stages so that the scanned primary electron beam 4 can be made always to pass through a center of the objective lens 6.

A scanning signal fed to the scanning coil unit 8 is controlled by a magnification control circuit 15 depending on the observation magnifying power. An aperture angle of the primary electron beam 4 at the objective lens 6 is determined by an aperture of the aperture plate 18 positioned below the focusing lens 5.

The secondary electron detector 50 is positioned outside the electron beam path between the scanning coil unit 8 and objective lens 6. There also are arranged around the electron beam path near the secondary electron detector 50 the above mentioned shielding electrode 12, the opposed electrode 11, the two sets of optical axis correction coils 19 and 20 for generating the combined magnetic field B orthogonal to the deflecting electric field E produced by the electrodes 11 and 12 (FIG. 1). Note that FIG. 2 does not specifically show the optical axis correction coils 19 and 20, but shows only the magnetic field B produced thereby for ease of illustration.

Figure 6:
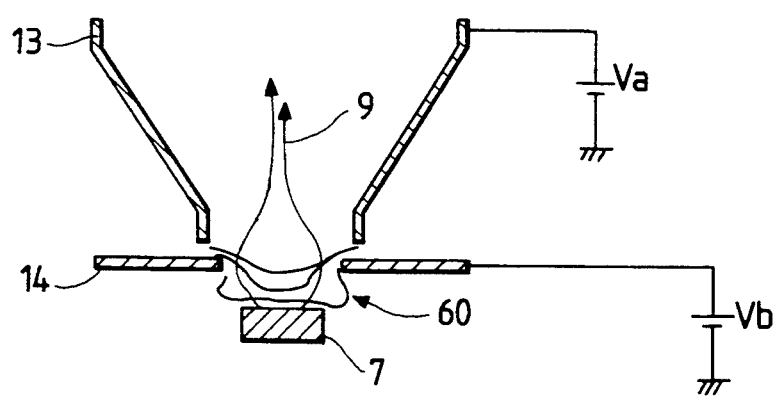
FIG. 6 is a schematic diagram illustrating a portion of an embodiment of the present invention.

A secondary electron accelerating electrode 13 is arranged between the electrodes 11 and 12 and the objective lens 6 and has a positive voltage Va applied there—across. A control electrode 14 is arranged just below the secondary electron accelerating electrode 13 and has a positive voltage Vb thereacross ($0 \leq Vb < Va$). As a result, as shown in FIG. 6, the secondary electron accelerating electrode 13 and the control electrode 14 produce an equipotential surface 60, which serves to focus the secondary electrons 9 so that the secondary electrons 9 emitted in a wide area can be efficiently directed to the secondary electron detector 50.

On the other hand, the secondary electrons 9 emitted from the specimen 7 have a tendency to be attracted into the objective lens 6 before spiralling up above the top (the electron source side) of the objective lens 6 by effect of the magnetic field of the objective lens 6. Further, the secondary electrons 9 will expand quickly when the lens magnetic field disappears. In the embodiment, however, the secondary electron accelerating electrode 13 provided in front of expansion of the secondary electrons 9 operates to accelerate the secondary electrons 9 to tens to hundreds of electron volts. The secondary electrons 9, therefore, will not be diverted to any significant extent even when the magnetic field of the object lens 6 disappears. Most of the secondary electrons 9 emitted from the specimen 7 will not divert much after the magnetic field disappears, but are directed into the area where the deflecting electric field E and magnetic field B exist.

After passing the secondary electron accelerating electrode 13, the secondary electrons 9 return to their original low energy state again before being forced in the same direction (toward the secondary electron detector 50) by the deflecting electric field E and magnetic field B. For this reason, most of the secondary electrons 9 pass through the shielding electrode 12 before being captured by the secondary electron detector 50. An image display apparatus 16 displays a magnified image of the specimen 7.

The primary electron beam 4 is subjected to a deflecting force by electric field E produced by the shielding electrode 12 and the opposed electrode 11. The force, as described above, can be canceled by the magnetic field B produced by the optical axis correction coils 19 and 20. The primary electron beam 4, therefore, can be made to pass into the objective lens 6 finally without any effect of the forces which exist along the beam path in the vicinity of detector 50.

The non-uniform attracting electric field 54 produced by the secondary electron detector 50 will not affect the primary electron beam 4 at all, since it is shielded by the shielding electrode 12.

The deflecting electric field E is produced only by a potential difference of the voltage V applied between the shielding electrode 12 and the opposed electrode 11. Therefore, one of the electrodes, for example, the opposed electrode 11 can be held at ground potential and only the shielding electrode 12 supplied with the positive voltage V. Otherwise, the opposed electrode 11 and the shielding electrode 12 can be held at the potentials $V = Vc \pm V/2$ where Vc is a center potential.

Figure 7:
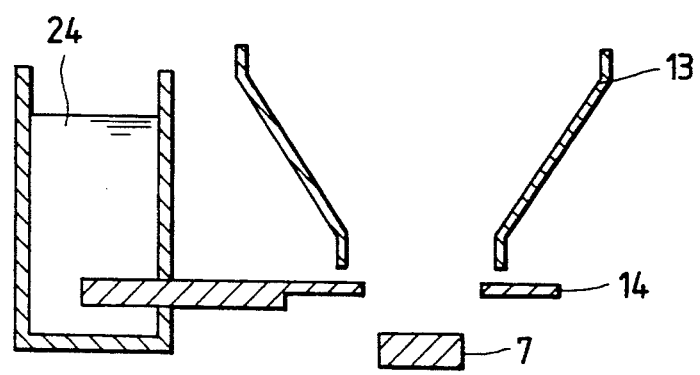
FIG. 7 is a schematic diagram illustrating a portion of an embodiment of the present invention.

The control electrode 14 can be cooled by, for example, liquid nitrogen 24, as shown in FIG. 7. The cooled control electrode 14 can increase a degree of vacuum around the specimen 7 and at the same time can prevent the specimen 7 from being contaminated by the electron beam irradiation.

Variable excitation currents $I_1$ and $I_2$ are supplied from a function generator 23 to the two sets of optical axis correction coils 19 and 20 so as to produce the combined current I corresponding to the combined magnetic field B, as seen in FIG. 1. The coils 19 and 20 can produce an additional magnetic field in superposition on the magnetic field B for canceling the deflection of the primary electron beam 4 due to the deflecting electric field E to correct an axis deviation of the primary electron beam 4 due to other causes. Alignment signal generators 21 and 22 generate signals $I_{a1}$ and $I_{a2}$, respectively, which are added to the variable excitation currents $I_1$ and $I_2$, respectively, so as to produce the additional magnetic field described above. In this way, the optical axis correction coils 19 and 20 cannot only correct the action of the deflecting electric field E for deflecting the secondary electrons 9, but also correct any axial deviation due to other causes.

As described so far, the present invention provides the following effects:

(1) The attracting electric field produced for capturing secondary electrons by the secondary electron detector is shielded by the shielding electrode to prevent the attracting electric field from leaking out to the electron beam path. This avoids any astigmatism in the primary bean so that a high resolution observation can be made.

(2) The magnetic field produced by the optical axis correction coil arrangement can correct the effect on the primary electron beam by action of the deflecting electric field E produced by the shielding electrode. This can prevent the primary electron beam from being deviated.

(3) The secondary electron accelerating electrode is provided so as to extend above the objective lens to accelerate the secondary electrons emitted from the specimen to a degree that the secondary electrons cannot be dispersed and can come into the area of the deflecting electric field E. Thus, the secondary electrons can be efficiently detected.

(4) The control electrode having an opening for passing the electron beam is provided on the optical axis below the secondary electron accelerating electrode. Thus, the secondary electrons emitted from a wide area of the specimen can be efficiently detected.

(5) The control electrode can be cooled so that contamination of the specimen due to irradiation of the electron beam can be minimized.

What is claimed is:

1. A scanning electron microscope that scans a primary electron beam emitted from an electron source on a specimen and detects secondary electrons emitted from the specimen on an electron source side of an objective lens, comprising:

secondary electron detecting means for detecting the secondary electrons, including means for producing an attracting electric field to capture the secondary electrons;

a shielding electrode provided between an optical path of the primary electron beam and the secondary electron detecting means, said shielding electrode being transparent to the secondary electrons and having a shielding effect for said attracting electric field;

an opposed electrode provided at a position facing the shielding electrode with the primary electron beam path being disposed therebetween and having a voltage applied between itself and the shielding electrode to produce a deflecting electric field in a spatial area along portion of the electron beam path for directing the secondary electrons toward said secondary electron detecting means; and coil means for producing a magnetic field in a direction orthogonal to both the deflecting electric field and the primary electron beam in said spatial area along said portion of the electron beam path so as to also direct the secondary electrons toward said secondary electron detecting means.

2. A scanning electron microscope according to claim 1, wherein the shielding electrode is a porous-plate member.

3. A scanning electron microscope according to claim 1, wherein the shielding electrode is a mesh-like member.

4. A scanning electron microscope according to claim 1, 2 or 3, wherein the coil means is excited to satisfy an equation $I = K \times V/(V_{acc})^{\frac{1}{2}}$, I being an exciting current of the coil means, V being a voltage applied across the shielding electrode and the opposed electrode, $V_{acc}$ being an accelerating voltage for the primary electron beam and K being a constant.

5. A scanning electron microscope according to claim 4, wherein the coil means comprises two sets of coils to which variable exciting currents are respectively supplied to thereby produce the exciting current I.

6. A scanning electron microscope according to claim 5, which further comprises means for superimposing alignment signals, for aligning the optical axis of the primary electron beam, on the variable exciting currents.

7. A scanning electron microscope according to claim 1, which further comprises a secondary electron accelerating electrode, having a predetermined positive potential and being arranged between said spatial area in which the deflecting electric field is produced and the specimen, to accelerate the secondary electrons emitted from the specimen toward said spatial area.

8. A scanning electron microscope according to claim 7, which further comprises a control electrode arranged between the secondary electron accelerating electrode and the specimen, the control electrode having an opening for passing the primary electron beam and the secondary electrons from the specimen, the control electrode further having a lower positive potential than the positive potential of the secondary electron accelerating electrode.

9. A scanning electron microscope according to claim 8, which further comprises cooling means for cooling the control electrode.

* * * * *